United States Patent
Lu et al.

(10) Patent No.: US 12,123,774 B1
(45) Date of Patent: Oct. 22, 2024

(54) METHOD AND APPARATUS FOR INTERFERENCE REDUCTION IN OPTICAL SENSING RECEIVERS

(71) Applicant: Avago Technologies International Sales Pte. Limited, Singapore (SG)

(72) Inventors: Junjie Lu, Irvine, CA (US); Jing Guo, Irvine, CA (US); Leon Samuel Wang, Irvine, CA (US); Xiaofeng Lin, Irvine, CA (US); Xicheng Jiang, Irvine, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 0 days.

(21) Appl. No.: 18/139,232

(22) Filed: Apr. 25, 2023

(51) Int. Cl.
  *G01J 1/46* (2006.01)
  *G01J 1/44* (2006.01)
(52) U.S. Cl.
  CPC ......... *G01J 1/46* (2013.01); *G01J 2001/4406* (2013.01); *G01J 2001/446* (2013.01)

(58) Field of Classification Search
  CPC . G01J 1/46; G01J 2001/4406; G01J 2001/446
  See application file for complete search history.

(56) References Cited

U.S. PATENT DOCUMENTS

| | | | |
|---|---|---|---|
| 2006/0251428 A1* | 11/2006 | Gieseler | H03K 5/082 398/189 |
| 2017/0086687 A1* | 3/2017 | Imai | A61B 5/7225 |

* cited by examiner

*Primary Examiner* — Thanh Luu
*Assistant Examiner* — Monica T Taba
(74) *Attorney, Agent, or Firm* — Foley & Lardner LLP

(57) ABSTRACT

An apparatus for detecting optical signals includes a photodetector. The photodetector is reverse-biased by a first voltage and a second voltage is added to the first voltage to provide an offset equal to the second voltage for the photodetector. A first circuit is coupled to the first circuit to provide the second voltage for the photodetector and a second circuit is coupled to the first circuit to provide the first voltage to the photodetector to reverse-bias the photodetector. The second circuit provides an output voltage proportional to a current of the photodetector at an output of the second circuit.

20 Claims, 7 Drawing Sheets

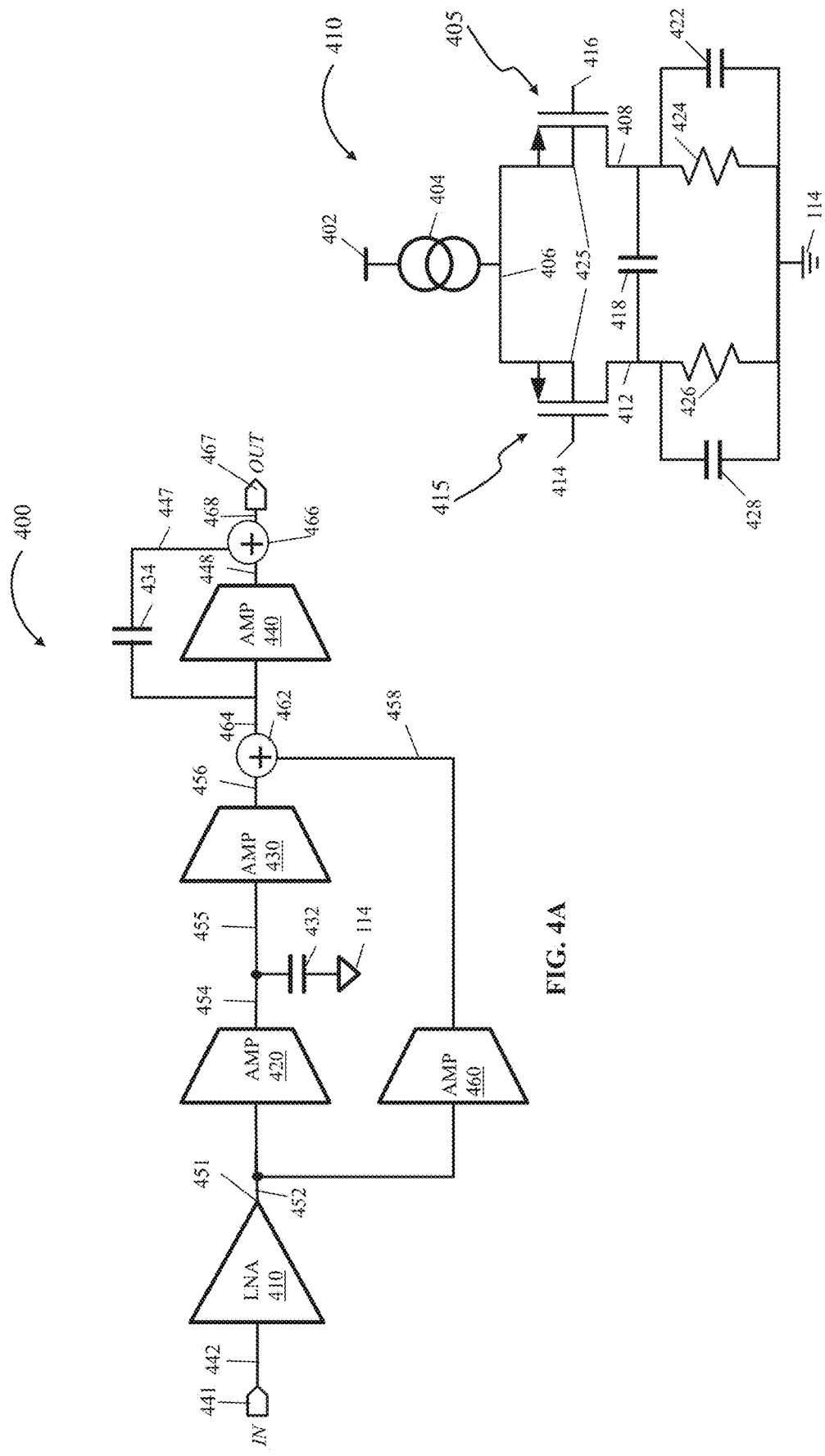

METHOD AND APPARATUS FOR INTERFERENCE REDUCTION IN OPTICAL SENSING RECEIVERS

TECHNICAL FIELD

The present description relates generally to receivers for optical sensing, including optical detectors, and in particular, to reduction of interference including radio frequency (RF) interference.

BACKGROUND

Optical sensing devices that include optical detectors are used for sensing optical signals. Optical signals may be weak and require amplification up to a hundred times or more by amplifier circuits. Electronic circuits including optical sensing devices are prone to electromagnetic interference. Thus, interference signals caused by electromagnetic interference may be added to the optical signal and amplified, up to a hundred times or more, by the amplifier circuits and contaminate the optical signals. Therefore, it is highly desirable to minimize the interference signal before being added to the optical signals and before the optical signal is amplified.

BRIEF DESCRIPTION OF THE DRAWINGS

Certain features of the subject technology are set forth in the appended claims. However, for purposes of explanation, several aspects of the subject technology are depicted in the following figures.

FIGS. 4A and 4B illustrate an amplifier circuit and a low noise amplifier circuit for the apparatus for detecting optical signals, according to various aspects of the subject technology.

DETAILED DESCRIPTION

Figure 1:
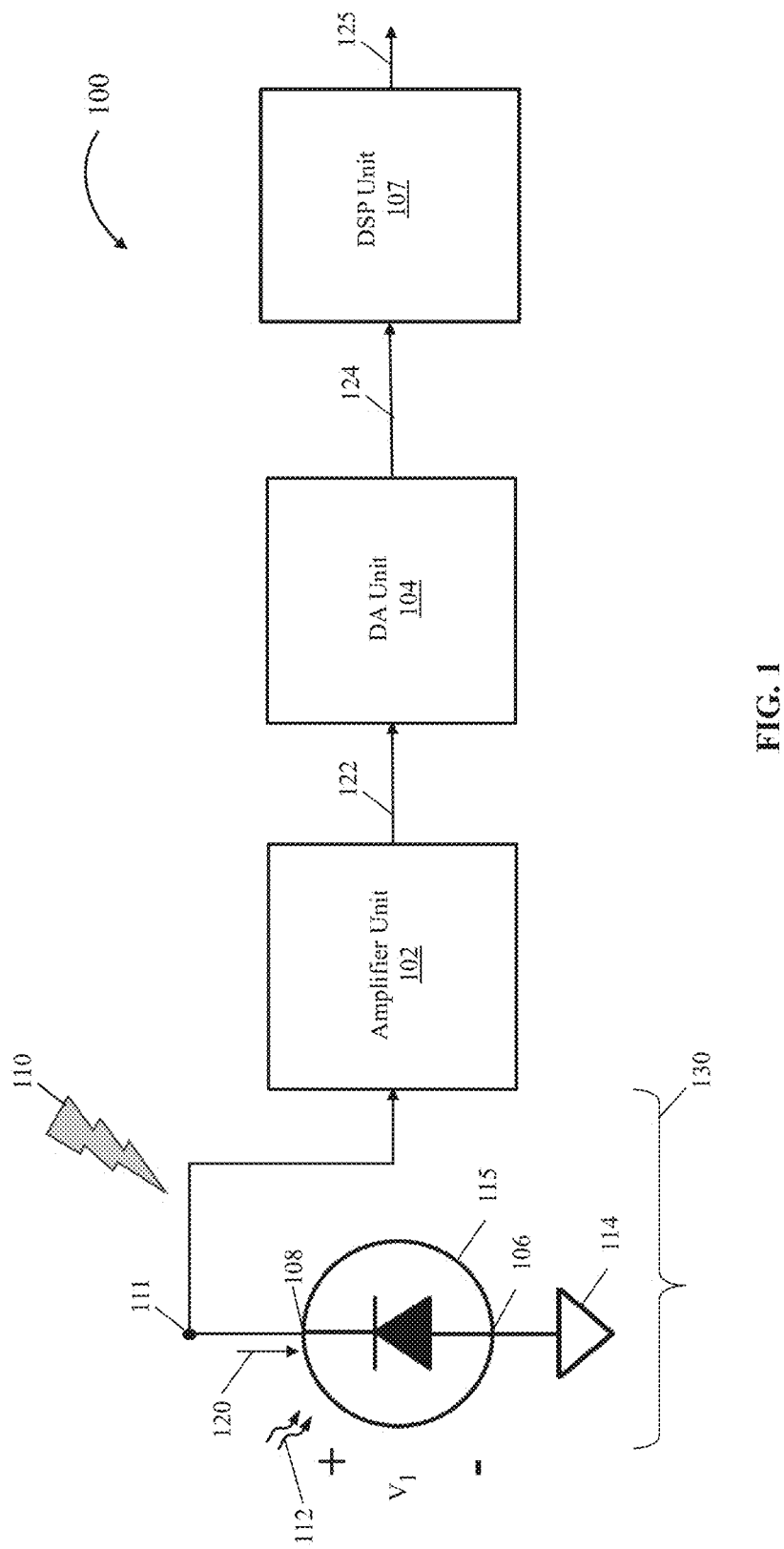
FIG. 1 illustrates an apparatus for detecting and processing optical signals.

The detailed description set forth below is intended as a description of various configurations of the subject technology and is not intended to represent the only configurations in which the subject technology may be practiced. The appended drawings are incorporated herein and constitute part of the detailed description, which includes specific details for providing a thorough understanding of the subject technology. However, the subject technology is not limited to the specific details set forth herein and may be practiced without one or more of the specific details. In some instances, structures and components are shown in a block-diagram form in order to avoid obscuring the concepts of the subject technology.

When an element is referred to herein as being "connected" or "coupled" to another element, it is to be understood that the elements can be directly connected to the other element, or have intervening elements present between the elements. In contrast, when an element is referred to as being "directly connected" or "directly coupled" to another element, it should be understood that no intervening elements are present in the "direct" connection between the elements. However, the existence of a direct connection does not exclude other connections, in which intervening elements may be present.

A circuit for detecting optical signals may have closed loops and, thus, electromagnetic interference, e.g., radio frequency (RF) electromagnetic (EM) interference, e.g., electromagnetic signals induced by power lines and devices using alternating current, in the environment may generate currents and voltages in the closed loops of the circuit and may impact the detected signals. In some embodiments, the detected optical signals produce low currents and voltages that require considerable amplification of hundred times or more to increase the detected signal to a voltage or current level that may be digitized and then processed. Because the electromagnetic interference is added to the detected signal before amplification, the amplification may also amplify the electromagnetic interference the same way that the detected optical signal is amplified. The circuits, apparatuses, and systems introduced below provide a fully differential architecture and has a very good interference rejection because of its symmetric manner. The noise affects both signal paths (positive and negative) nearly the same, so when the negative signal is subtracted from the positive signal, the noise on both signals cancels each other. Thus, the fully differential signal paths may cause the common-mode interference (CMI) to be subtracted between positive and negative output nodes and, thus, the CMI is rejected, noise power is reduced, and also RF electromagnetic (EM) interference and electrostatic discharge (ESD) effects are reduced. Also, in the circuit for detecting optical signals, capacitors are coupled in parallel to the interfaces between different portions of the circuit, which may be used to filter the CMI and noise.

Also, capacitors may be used for holding different charges and providing different voltages to bias, e.g., to reverse-bias, a photodetector of the circuit for detecting optical signals. In some embodiments, the circuit for detecting optical signals is used at different periods of reset and scan. During the scan period, the charges, e.g., the voltages, of the capacitors are used to bias the photodetector and detect optical signals. During the reset period, the detection of the optical signals is stopped and the capacitors are recharged to compensate a charge lost during the scan mode. In some embodiments, the scan period is a hundred times or more longer than the reset mode.

The circuit for detecting optical signals may have a controller coupled to a plurality of switches that are coupled to the capacitors. By turning the switches on or off the controller may alter the circuit mode of operation between the reset and scan modes, to charge the capacitors during the reset mode and use the capacitor charges to bias the photodetector during the scan mode. In some embodiments, the apparatuses, circuits, devices, and systems introduced below that provide a fully differential architecture reduces the input referred current detection error, induced by the CMI, to more than two orders of magnitude lower compared to circuits that do not have the fully differential architecture.

FIG. 1 illustrates a system, e.g., an apparatus, for detecting and processing optical signals. An apparatus 100 of FIG. 1 shows a circuit 130, e.g., a circuit for detecting optical signals, which includes a photodetector 115 coupled between a voltage node 111 and a ground 114. As shown, an anode 106 of the photodetector 115 is coupled to the ground 114 and a cathode 108 of the photodetector 115 is coupled to the voltage node 111. In some embodiments, a voltage V1 of the voltage node 111 is forced, e.g., induced, by the amplifier unit 102 and, thus, the photodetector 115 is reverse-biased by the voltage V1. In some embodiments, the photodetector 115 is a diode that is reverse-biased and an optical signal 112, e.g., light rays, impinge on a depletion region (not shown) of the photodetector 115 to generate charged carriers proportional to an intensity of the light rays. In some embodiments, the charged carriers are determined to be proportional to the intensity of the light rays when by increasing the intensity of the light rays by n times, where n is 2, 3, . . . , the number of charged carriers is increased by n times. As shown, the generated charge carriers, produce a current 120, e.g., an input signal, by the photodetector 115. In some embodiments, the voltage V1 is between about 0.1 volts and 0.5 volts. In some embodiments, in a reverse-biased diode a voltage coupled to the cathode of the diode is higher than the voltage coupled to an anode of the diode. In some embodiments, the photodetector 115 is a diode that is reverse-biased.

As shown in FIG. 1, the apparatus 100 also includes an amplifier unit 102, a data acquisition unit, e.g., a DA unit 104, and a digital signal processing unit, e.g., a DSP unit 107. The current 120 or a voltage generated by the current 120 and proportional to the current 120 is amplified by the amplifier unit 102. In some embodiments, the amplifier unit 102 amplifies the input signal several folds, e.g., a hundred times or more, to produce an output signal 122, e.g., a voltage, which is used by the DA unit 104.

As shown in FIG. 1, in some embodiments, an EM interference (EMI), e.g., EMI 110, is present in an environment of the circuit 130 of the apparatus 100. The EMI 110 may induce an interference current in the circuit 130 that is amplified along with the current 120 and is similarly added, as an interference signal, to the output signal of the amplifier unit 102 and, thus, the output signal 122 includes the interference signal. The output signal 122, e.g., an output voltage, of the amplifier unit 102 is received by the DA unit 104, as an input signal, to produce an output signal 124 of the DA unit 104. In some embodiments, the DA unit 104 digitizes, by an analog to digital converter (not shown), the input signal and, thus, the output signal 124 is a digitized form of the output signal 122. The output signal 124 is then fed into the DSP unit 107 for processing and to generate an output signal 125.

Figure 2:
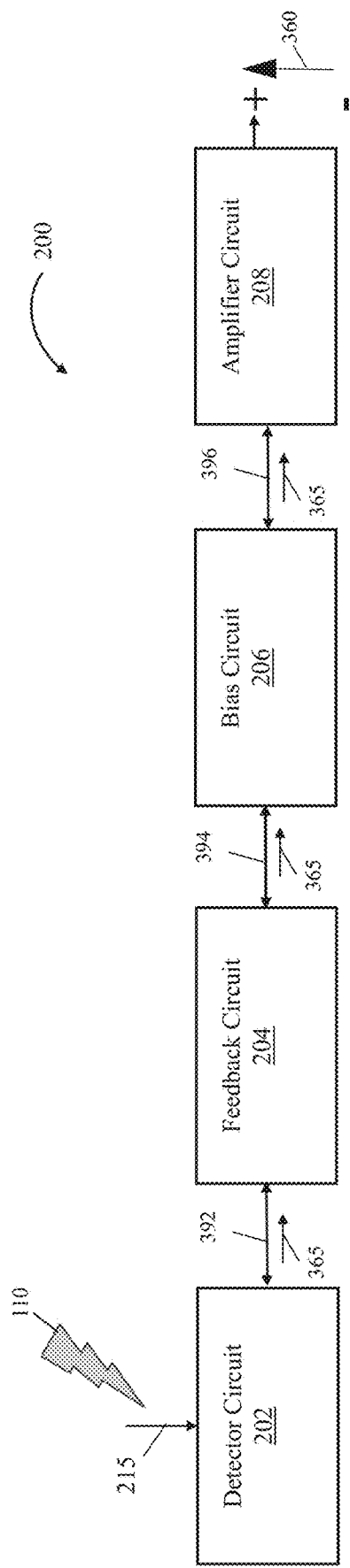
FIG. 2 illustrates an apparatus for detecting optical signals, according to various aspects of the subject technology.

FIG. 2 illustrates an apparatus for detecting optical signals, according to various aspects of the subject technology. In some embodiments, an apparatus 200 of FIG. 2 shows is a combination of the circuit 130 and the amplifier unit 102 of FIG. 1. As shown, the apparatus 200 includes a detector circuit 202 that includes the photodetector 115. The apparatus 200 also includes a feedback circuit 204, a bias circuit 206, and an amplifier circuit 208 that generates an output 360, e.g., an output voltage. The detector circuit 202 is coupled to the feedback circuit 204 through an interface 392. The feedback circuit 204 is coupled to the bias circuit 206 through an interface 394 and the bias circuit 206 is coupled the amplifier circuit 208 through an interface 396. The interfaces 392, 394, and 396 are used to couple voltages and transfer currents, at either direction, between the circuits at both sides of the interfaces 392, 394, and 396. The detector circuit 202, the feedback circuit 204, the bias circuit 206, the amplifier circuit 208, and the interfaces 392, 394, and 396 are described in more details below with respect to FIGS. 3A, 3B, and 3C. FIG. 2 also shows that the EMI 110 may affect the detector circuit 202 and may generate an EMI current, a current 215, in the detector circuit 202. In some embodiments, the feedback circuit 204 is used to filter the EMI and prevents the EMI from reaching the amplifier circuit 208 coupled to the bias circuit 206. In some embodiments, the amplifier circuit 208 receives a current 363 via the feedback circuit 204 and the bias circuit 206. In some embodiments, the resistors 316, 318, 336, and 338 are have large resistance, e.g., more than one mega ohm and also the capacitors 322, 324, 332, and 334 are charged such that a sum of the currents through the resistors 316, 318, 336, and 338, and the currents through the capacitors 322, 324, 332, and 334 is negligible. Thus, the current 363 is almost the same as, e.g., within one percent difference of, a photodetector current 365. Thus, the amplifier circuit 208 amplifies the photodetector current 365 to provide the output voltage 360 that is proportional to the photodetector current 365. In some embodiments, the output voltage 360 is determined to be proportional to the photodetector current 365 when by increasing the photodetector current 365 by n (e.g., n=2, 3, etc.) times, the output voltage 360 is also increased by n times. In some embodiments, the currents through the resistors 316, 318, 336, and 338 is not negligible and adds a current bias is added to the photodetector current 365 and the current 363 is the photodetector current 365 plus a current bias. When the amplifier circuit 208 amplifies the current 363 an output voltage 360 may be provided that is proportional to the photodetector current 365 plus a voltage bias and the voltage bias may limit a dynamic range of the output voltage 360.

In some embodiments, by receiving a voltage at an interface coupled between two circuits, e.g., between circuit-A and circuit-B, the circuit-A provides, e.g., delivers, the voltage at the interface and the circuit-B receives the voltage at the interface. Thus, in some embodiments, the interface is an output port of the circuit-A and also is an input port of the circuit-B. Also, in some embodiments, the output port of the circuit-A and the input port of the circuit-B are coupled through two nodes, e.g., node-1 and node-2. In some embodiments, by receiving a current at the interface coupled between circuit-A and circuit-B, the circuit-A provides, e.g., delivers, the current at the node-1 of the interface and the circuit-B receives the current at the node-1 of the interface.

Figure 3A:
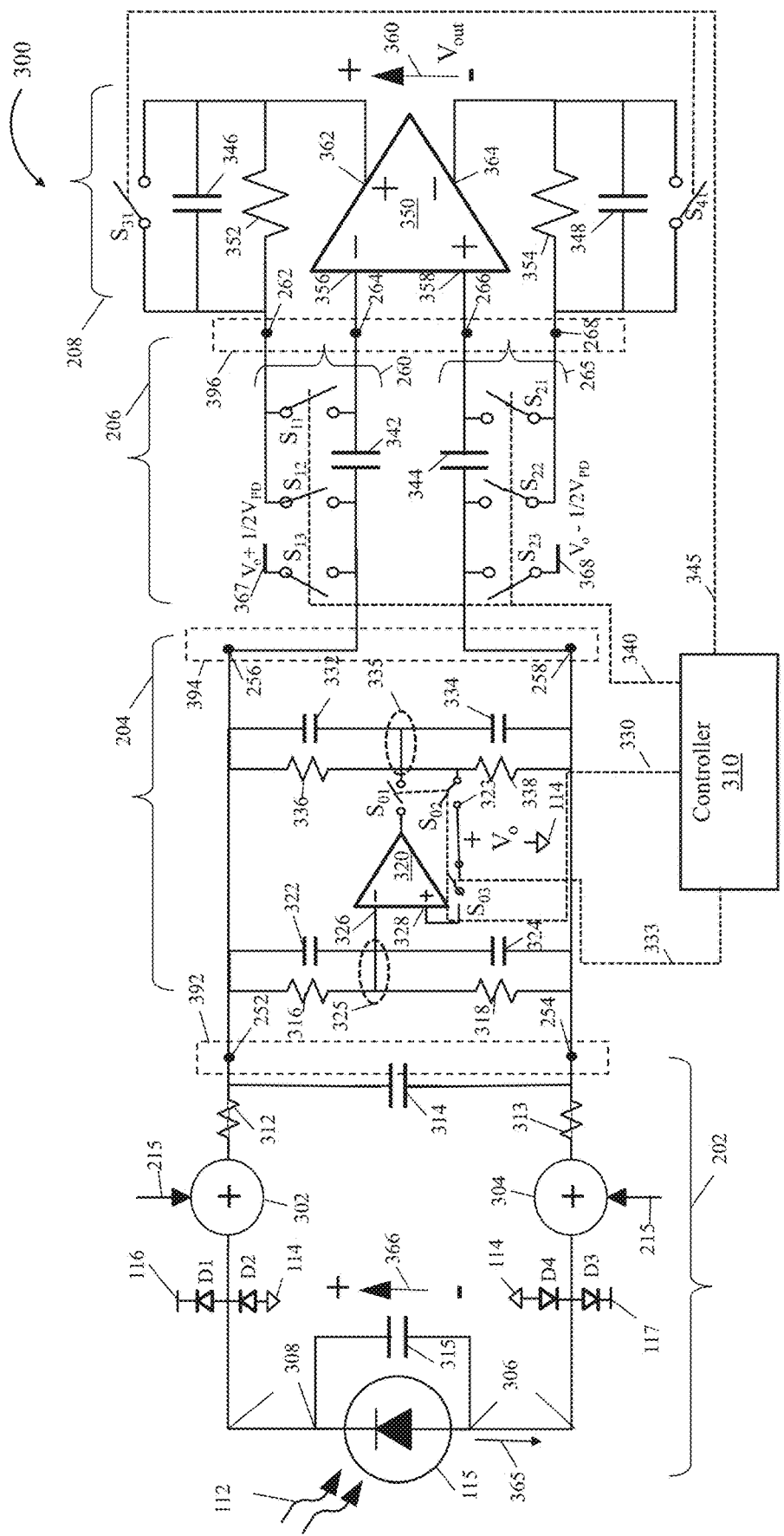
FIGS. 3A, 3B, 3C, and 3D illustrate an apparatus for detecting optical signals, the apparatus for detecting optical signals during reset mode, the apparatus for detecting optical signals during scan mode, a time-wise distribution of reset and scan modes, according to various aspects of the subject technology.

FIGS. 3A, 3B, 3C, and 3D illustrate an apparatus for detecting optical signals, the apparatus is configured to pre-store the photodetector bias voltage during a reset mode and to detect optical signals during a scan mode, with a time-wise distribution of reset and scan modes, according to various aspects of the subject technology. FIG. 3A shows the apparatus 300, e.g., a system, for detecting optical signals 112 that impinge on the photodetector 115. In some embodiments, the optical signal are optical pulses that are detected by the photodetector 115. In some embodiments, as described, the photodetector 115 is reverse-biased and, thus, a voltage between both nodes of the photodetector 115, which are a cathode 308 and an anode 306 of the photodetector 115, is a positive voltage. In some embodiments, as noted above, a voltage 366, e.g., a voltage $V_{PD}$ of the photodetector 115, when reverse-biased, is between about zero volts and about 10 volts. Thus, in some embodiments, the voltage of the anode 306 is $V_o$ volts and the voltage of the cathode 308 is between $V_o$ volts and $V_o+10$ volts.

In some embodiments, as shown, a capacitor 315 is coupled in parallel with the photodetector 115. As shown, in response to the optical signal 112 impinging on the photodetector 115, a photodetector current 365 is generated in the photodetector 115 of the detector circuit 202, e.g., a first circuit. In some embodiments, the capacitor 315 is used to cause a short-circuit parallel to the photodetector 115 for the current and/or voltage fluctuations, e.g., high frequency fluctuations, and prevent the fluctuation to impact the photodetector 115. In some embodiments, ground bouncing interference to the current is absorbed by the capacitor 315 and the fully differential structure of the apparatus 300 is maintained.

The detector circuit 202 is further coupled to a first group of ESD diodes D1 and D2 and to a second group of ESD diodes D3 and D4. In some embodiments, the diode D1 is coupled and reverse-biased between the cathode 308 and the voltage node 116, which has a positive voltage between about 2 volts and 5 volts above the voltage of the cathode 308. The diode D2 is coupled and reverse-biased between the cathode 308 and the ground 114. In some embodiments, the diodes D1 and D2 are reverse-biased diodes that are used for preventing a damage to the apparatus 300 because of the electrostatic discharge (ESD). In some embodiments, the diodes D1 and D2 transfer at least a part of the ESD, out of the detector circuit 202. Similarly, in some embodiments, the diode D3 is coupled and reverse-biased between the anode 306 and a voltage node 117, which has a positive voltage between about 2 volts and 5 volts above the voltage of the anode 306. The diode D4 is coupled and reverse-biased between the anode 306 and the ground 114. In some embodiments, the reverse-biased diodes D1 and D2, coupled to the detector circuit 202 and adjacent to the cathode 308, and also reverse-biased diodes D3 and D4, coupled to the detector circuit 202 and adjacent to the anode 306 are used for preventing a damage to circuit components of the apparatus due to electrostatic discharge (ESD) and transferring the ESD, e.g., at least part of the ESD, e.g., a flow of current caused by ESD, out of the detector circuit 202. The EMI impinging on the ESD diodes may be rectified and generate a current that is not from photodetector, causing error in the apparatus 300. In some embodiments, the symmetrical configuration of the first and second groups of diodes helps balance the non-linearity on both inverting node 326 and non-inverting node 328 of an operational-amplifier, Op-Amp 320.

In addition to the ESD, as described above, the detector circuit 202 may be affected by the EMI from a neighboring device or circuit, and as shown the EMI 110 may generate an additional EMI current, the current 215, in the detector circuit 202 such that the current 215 is added to the photodetector current 365 of the photodetector 115. Similar to the ESD, the current 215 is induced in the detector circuit 202. Because the apparatus 300 provides the fully differential signal paths, the addition of the current 215, which is induced, may be conceptually represented by symmetrically located addition modules 302 and 304. Similar to the current caused by non-linear characteristic of the ESD diodes, in some embodiments, the current 215 is applied as common mode to the apparatus 300 and is rejected, e.g., removed, by the fully differential structure of the apparatus 300. In some embodiments, the current 215 includes a current caused by the flow of the current caused by the source of the ESD. In some embodiments, the first group of ESD diodes are physically close to about half of the source of the ESD and the second group of ESD diodes are physically close to another half of the source of the ESD. In some embodiments, a combination of the feedback circuit 204, the bias circuit 206, and the amplifier circuit 208 provides the fully differential signal paths.

As shown in FIG. 3A, the detector circuit 202 is connected to feedback circuit 204 through the interface 392 at an output of the detector circuit 202 and an input of the feedback circuit 204, which provides a common mode voltage $V_o$, e.g., an offset voltage, for the reverse-biased photodetector 115. In some embodiments, the offset voltage increases the dynamic range and prevent non-linearity, e.g., clipping from top or bottom, when a current is induced by EMI and/or the ESD diodes. The interface 392 includes the two nodes 252 and 254, e.g., connection nodes, and voltages or currents are shared or transferred through the nodes 252 and 254. The feedback circuit 204 includes a first RC circuit that includes a resistor 316, e.g., a first resistor, and a resistor 318, e.g., a second resistor coupled, in series, coupled to the interface 392 between the nodes 252 and 254. The first RC circuit further includes a capacitor 322, e.g., a first capacitor, and a capacitor 324, e.g., a second capacitor coupled to the interface 392 between the nodes 252 and 254. In some embodiments, as shown, a midpoint between the resistor 316 and the resistor 318 and the midpoint between the capacitor 322 and the capacitor 324 are connected to each other to provide a junction point 325, e.g., a first junction point or a first node. In some embodiments, the interface 392 is an output port of the detector circuit 202 and is an input port of the feedback circuit 204. In some embodiments, the interfaces 392, 394, or 396 is either an input port or an output port or both based on the circuits coupled to the interfaces 392, 394, or 396. In some embodiments, the interface 392 is coupled between the detector circuit 202 and the feedback circuit 204, the interface 394 is coupled between the feedback circuit 204 and the bias circuit 206, and the interface 396 is coupled between the bias circuit 206 and the amplifier circuit 208. In some embodiments, the fully differential signal paths opens the possibility of increasing the common mode voltage to half the supply rails, e.g., power supply voltage of the power supply lines. Higher common mode voltages reduce the non-linearity produced by ESD protection circuit and EMI due to balance swing, e.g., caused by reverse-biased diodes that are used for ESD protection.

In addition, the capacitor 322 is coupled in parallel with the resistor 316 between the node 252 and the junction point 325 and the capacitor 324 is coupled in parallel with the resistor 318 between the junction point 325 and the node 254 In some embodiments, the values of the resistor 316 and the resistor 318 and the values of the capacitor 322 and the capacitor 324 are selected such that the values do not affect the photodetector signal being processed. Also, the high frequency noise and interferences outside a frequency band of the optical signal 112 are short circuited by the capacitor 322 and the capacitor 324 and do not move from the detector circuit 202 beyond the feedback circuit 204. In some embodiments, as shown in FIG. 3A, the detector circuit 202 of the apparatus 300 also includes an RC filter, e.g., a low-pass RC filter, coupled to the interface 392. As shown, a capacitor 314 of the RC filter is coupled between the nodes 252 and 254 and resistors 312 and 313 are coupled between the nodes 252 and 254 and the addition modules 302 and 304, respectively. In some embodiments, the resistors 312 and 313 have values such that the fully differential structure of the apparatus 300 is maintained, e.g., have same values. In some embodiments, the low-pass RC filter is designed and the capacitor 314 and the resistors 312 and 313 are selected for filtering the EMI and ESD and other unwanted signals outside the frequency band of the optical signal 112.

The feedback circuit 204 is connected to the bias circuit 206 through the interface 394 at an output of the feedback circuit 204 and an input of the bias circuit 206. The feedback circuit 204 includes a second RC circuit that includes a resistor 336, e.g., a first resistor, and a resistor 338, e.g., a second resistor, of the second RC circuit coupled, in series, to the interface 394 between the two nodes 256 and 258 of the interface 394. Similarly, voltages or currents are shared or transferred through the nodes 256 and 258 between the feedback circuit 204 and the bias circuit 206. In addition, a capacitor 332, e.g., a first capacitor, is coupled in parallel with the resistor 336 between the node 256 and a junction point 335, e.g., a second junction point or a second node, and a capacitor 334, e.g., a second capacitor, is coupled in parallel with the resistor 338 between the junction point 335 and the node 258. In some embodiments, the resistor 336 and the resistor 338 have the same value, which is similar to the same value of the resistor 316 or the resistor 318 of the first RC circuit. In some embodiments, the capacitor 332 and the capacitor 334 have the same value, which is similar to the same value of the capacitor 322 or the capacitor 324. Also that the high frequency noise and interferences outside a frequency band of the optical signal 112 are short circuited by the capacitor 332 and the capacitor 334 and do not pass beyond the feedback circuit 204.

As shown in FIG. 3A, the feedback circuit 204 further includes the Op-Amp 320, such that the inverting node 326 of the Op-Amp 320 is connected to the junction point 325 and an output node of the Op-Amp 320 is connected via a switch $S_{O1}$ to the junction point 335. The junction point 335 is also coupled to a switch $S_{O1}$ and the non-inverting node of the Op-Amp 320 is coupled to a switch $S_{O3}$. Another node of the switches $S_{O2}$ and $S_{O3}$ are connected to each other via a connection line 323 and the common mode voltage $V_o$, e.g., the offset voltage, is coupled between the connection line 323 and the ground 114. In some embodiments, a voltage source, e.g., a constant voltage source, providing a first voltage is connected to both the anode and the cathode of a diode to increase the voltage of the anode and the cathode by the first voltage. Thus, the voltage between the anode and cathode of the diode does not change but both the voltage of the anode and the voltage of the cathode are increased by the first voltage. In some embodiments, the increase of the voltage of the cathode and anode of the diode by the same value is an offset added to the voltage of the diode.

As shown, the apparatus 300 also includes a controller 310. The controller 310 is coupled to the switchers $S_{O1}$, $S_{O2}$, and $S_{O3}$ by a control line 330 and a control line 333, e.g., connection lines, to control the switches and turns each one of the switches $S_{O1}$, $S_{O2}$, and $S_{O3}$ on and off. In some embodiments, the Op-Amp 320, in the reset mode, is disconnected and the capacitor 332 and the capacitor 334 are charged for being used during the scan mode. In some embodiments, the switches $S_{O1}$, $S_{O2}$, and $S_{O3}$ and other switches introduced below, are transistors such as field effect transistors (FET) and the controller 310 is coupled to a gate of the switches $S_{O1}$, $S_{O2}$, and $S_{O3}$ by control the control line 330 and the control line 333 such that by applying a voltage to the gate of the FET, or disconnecting the voltage, the switch between drain and source of the FET of each switch is controlled and is turned on or off.

As noted above, the bias circuit 206 is connected to the feedback circuit 204 through the interface 394 introduced above. The bias circuit 206 includes a first group 260 of switch-capacitor that includes a capacitor 342 and three switches $S_1$, $S_{12}$, and $S_{13}$ that are coupled to the capacitor 342. Also, as shown, the bias circuit 206 includes a second group 265 of switch-capacitor that includes a capacitor 344 and three switches $S_{21}$, $S_{22}$, and $S_{23}$ that are coupled to the capacitor 344. The switches of the first group 260 and the second group 265 are controlled by the controller 310 through the control lines 340 and turns each one of the switches $S_{21}$, $S_{22}$, or $S_{23}$ on and off. In some embodiments, the charged capacitors 342 and 344 are coupled separately, via the feedback circuit 204, to the cathode 308 and the anode 306 of the photodetector 115 to provide the voltage 366 to reverse-bias the photodetector 115. In some embodiments, the common mode voltage $V_o$ and the photodetector 115 voltage $V_{PD}$ at each cathode 308 or anode 306 may independently change. In some embodiments, the common mode voltage $V_o$ changes between 0.5 volts and 10 volts and the photodetector 115 voltage $V_{PD}$ changes between zero volts and 10 volts.

In some embodiments, the common mode voltage $V_o$, or two similar voltages, are added to the voltage of the cathode 308 and the anode 306 of the photodetector 115 and the sum voltage is applied to the cathode 308 and the anode 306. Thus, a voltage $V_A$ of the anode 306 and a voltage $V_C$ of the cathode 308 may respectively be presented by equations (1) and (2).

$$V_A = V_o - \tfrac{1}{2} V_{PD} \qquad \text{Eq (1)}$$

$$V_C = V_o + \tfrac{1}{2} V_{PD} \qquad \text{Eq (2)}$$

Thus, the common mode voltage $V_o$ is applied as a common offset to both anode 306 and the cathode 308 and the voltage across the photodetector 115 is $V_{PD}$. The voltage $V_o$ or $V_{PD}$ in equations (1) or (2) may independently change by up to ten folds and still the voltage of the anode 306 and the voltage of the cathode 308 may be represented by equations (1) and (2) with modified common mode and photodetector voltages. The apparatus 300 will provide the fully differential paths, if the modified common mode and photodetector voltages are within an acceptable range. In some embodiments, an output voltage of the Op-Amp 320 is proportional to the voltage of the non-inverting node 328 minus the voltage of the inverting node 326. Thus, the voltage of the inverting node 326 is multiplied by negative one and then is added to the voltage of the non-inverting node 328. In some embodiments, in the linear region, the Op-Amp 320 has a gain K between a thousand and ten thousand such that the output voltage of Op-Amp 320 is K times the input voltage, which is the voltage difference between the non-inverting node 328 and the inverting node 326. Since the output voltage of the Op-Amp 320 is limited by the voltage sources of the Op-Amp 320 that are about 2 to 15 volts, the input voltage of the Op-Amp 320 is very small and about zero volts. Therefore, when the Op-Amp 320 operates in the linear region, the non-inverting and inverting nodes 328 and 326 of the Op-Amp 320 may be assumed to have the same voltage. In some embodiments, as shown by equations (1) and (2), the common mode voltage $V_o$ is an offset voltage to both the anode 306 and the cathode 308.

As shown, the apparatus 300 also includes the amplifier circuit 208 that is coupled to the bias circuit 206 through the interface 396 and via nodes 262, 264, 266, and 268 of the interface 396. The capacitor 342 is coupled between the node 264 and the node 256. The switch $S_{11}$ is coupled between the nodes 262 and 264, the switch $S_{12}$ is coupled between the nodes 256 and 262, and the switch $S_{13}$ is coupled between the node 256 and a voltage node 367, which may be coupled to a positive node of a voltage source having a voltage $V_o + \tfrac{1}{2} V_{PD}$ relative to the ground (not shown), where $V_o$ is the common mode voltage and $V_{PD}$ is the voltage of the photodetector 115 that is reverse-biased, e.g., a voltage $V_{RB}$. The capacitor 344 is coupled between the node 266 and the node 258. The switch $S_{21}$ is coupled between the nodes 266 and 268, the switch $S_{22}$ is coupled between the nodes 258 and 268, and the switch $S_{23}$ is coupled between the node 258 and a voltage node 368, which may be coupled to a positive node of a voltage source having a voltage $V_o-½ V_{PD}$ relative to the ground (not shown).

The amplifier circuit 208 includes an Op-Amp 350 with a non-inverting node 358 coupled to the node 266 and an inverting node 356 coupled to the node 264. The Op-Amp 350 includes a positive output node 362 and a negative output node 364. A resistor 352, a capacitor 346, and a switch $S_{31}$ are coupled in parallel between positive output node 362 and the node 262 of the interface 396. Also, a resistor 354, a capacitor 348, and a switch $S_{41}$ are coupled in parallel between negative output node 364 and the node 268 of the interface 396. Because the apparatus 300 provides fully differential signal paths, the capacitors 346 and 348 have the same values and are selected based on the bandwidth of the apparatus 300. Also, the resistors 352 and 354 have the same resistance values and are selected based on the gain of the apparatus 300. In some embodiments, the resistors 352 and 354 have a resistance between one kilo ohms and ten mega ohms and the capacitors 346 and 348 have a capacitance between 10 femtofarad and 1 nanofarad. In addition, the controller 310 is coupled to the switchers $S_{31}$ and $S_{41}$ by a control line 345 to control the switches and turns each one of the switches $S_{31}$ or $S_{41}$ on and off. As shown, in some embodiments, a voltage between the positive output node 362 and the negative output node 364 if the Op-Amp 350 is an output voltage 360 ($V_{out}$) of the apparatus 300. In some embodiments, the Op-Amp 350 works in the linear region of an Op-Amp and, thus, the voltage of the inverting node 356 is equal to the voltage of the non-inverting node 358. Therefore, the sum of the voltages of the capacitors 342 and 344 will be applied to the photodetector 115, e.g., applied to the anode 306 and cathode 308, and the voltage 366 is equal to the sum of the voltages of the capacitors 342 and 344.

In some embodiments, in the linear region, the Op-Amp 350 has a gain K between a thousand and ten million such that the output voltage of Op-Amp 350 is K times the input voltage, which is the voltage difference between the non-inverting node 358 and the inverting node 356. Since the output voltage of the Op-Amp 350 is limited by the voltage sources of the Op-Amp 350 that are about 2 to 15 volts, the input voltage of the Op-Amp 350 is very small and about zero volts. Therefore, when the Op-Amp 350 operates in the linear region, the non-inverting and inverting nodes 358 and 356 of the Op-Amp 350 may be assumed to have the same voltage.

Figure 3B:
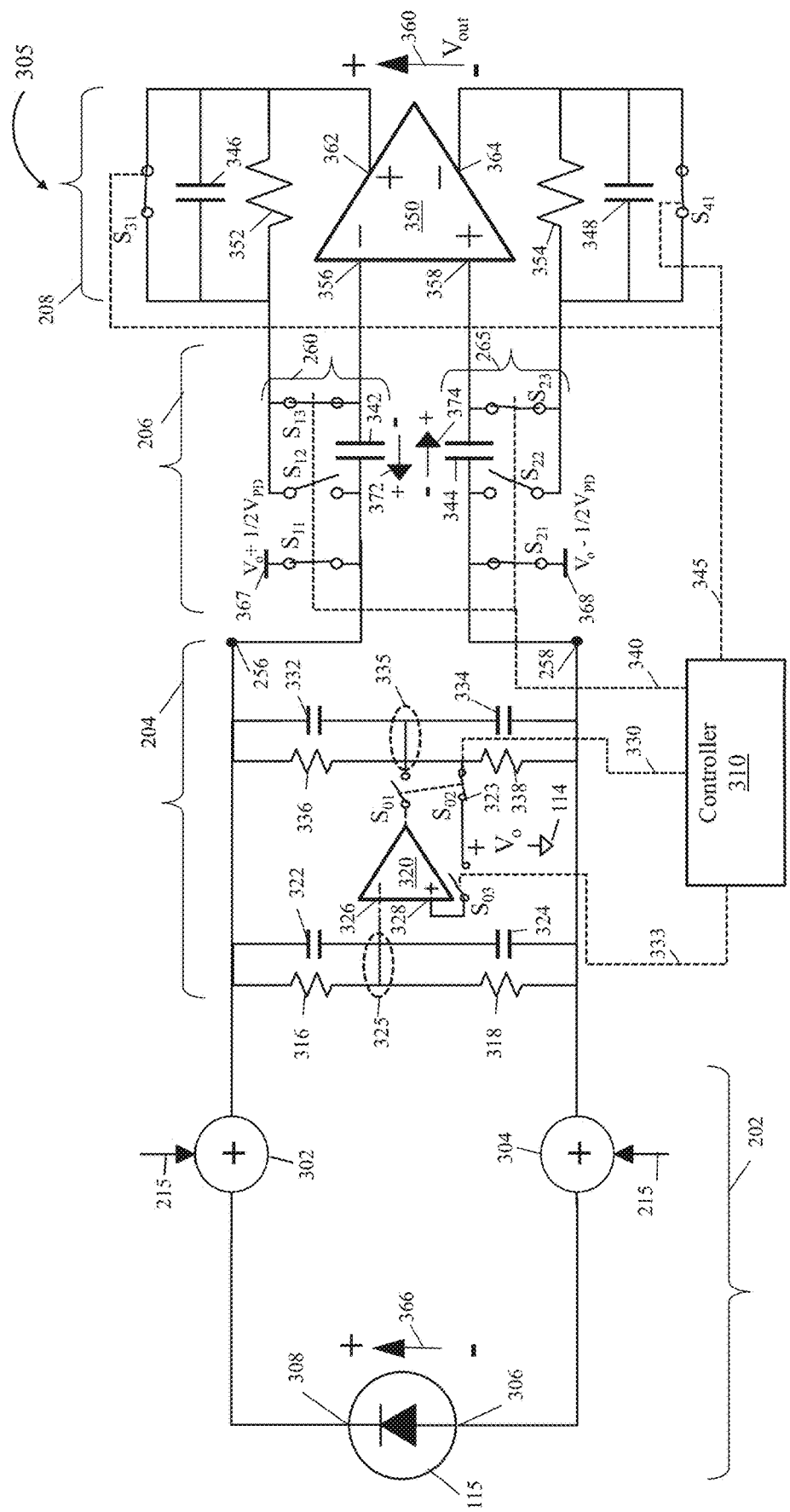

FIG. 3B shows an apparatus 305 during reset mode. The apparatus 305, e.g., a system, is the same as apparatus 300 with a difference that two or more switches are closed and the apparatus 305 does not show the RC filter coupled to the interface 392. The apparatus 305 does not show the first and second groups of diodes and does not show the capacitor 315. The apparatus 305 includes the detector circuit 202 but because the current 363 is bypassed by switches $S_{11}$ and $S_{21}$, and does not circulate through the apparatus 305, the output voltage 360 is zero. The apparatus 305 also includes the feedback circuit 204 with the switch $S_{01}$ that is opened, e.g., off, the switch $S_{02}$ that is closed, e.g., on, and the switch $S_{03}$ that is opened. By opening the switch $S_{01}$, the Op-Amp 320 is disconnected and by closing the switch $S_{02}$, the common mode voltage $V_o$ is applied to the junction point 335. The apparatus 305 further includes the bias circuit 206 with the switches $S_{12}$ and $S_{22}$ that are opened and the switches $S_{11}$, $S_{13}$, $S_{21}$, and $S_{23}$ that are closed. The apparatus 305 includes the amplifier circuit 208 with the switches $S_{31}$, and $S_{41}$ are closed. Because of the setting of the switches to close and open and the Op-Amp 350 being in the linear region during the reset mode, the voltages of the non-inverting node 358, the inverting node 356, the negative output node 364, and the positive output node 362 are the same.

Therefore, the capacitor 342 and the capacitor 344 store charges such that the capacitor 342 is charged to a voltage 372 that is $½V_{PD}$ and the capacitor 344 is charged to a voltage 374 that is $½V_{PD}$, with a difference that the voltages 372 and 374 are defined in opposite directions. Also, the nodes 256 and 258 have voltages $V_o+½ V_{PD}$ and $V_o-½ V_{PD}$, respectively. The junction points 335 have the common mode voltage $V_o$ and the capacitor 332 and the capacitor 334, and the capacitor 322 and the capacitor 324 are charged to voltage $½V_{PD}$. Finally, the cathode 308 of the photodetector 115 has the voltage $V_o+½ V_{PD}$, the anode 306 of the photodetector 115 has the voltage $V_o-½ V_{PD}$, and the reverse-bias voltage of photodetector 115, which is the voltage 366 has the value $V_{PD}$. Thus, the setting of the switches to close and open during the reset mode may be performed initially to charge the capacitors, e.g., a set mode, or repeated periodically to recharge the capacitors. In some embodiments, a first portion of the voltage $V_{PD}$ is applied to the cathode 308 and a remaining second portion of voltage $V_{PD}$ with opposite polarity is applied to the anode 306. In some embodiments, the first and second portions of the voltage $V_{PD}$ are equal, e.g., about equal with relative difference of not more than 2 percent, to provide the fully differential signal paths for the apparatus 300. In some embodiments, the voltages to the cathode 308 and anode 306 of the photodetector 115 are supplied from two separate sources, e.g., two capacitors or two power supplies. As shown in FIG. 3B, the voltage 372 of the capacitor 342 is applied to the cathode 308 and the voltage 374 of the capacitor 344 is applied to the anode 306. In some embodiments, the voltages 372 and 374 have opposite polarities and the magnitude of the voltages 372 and 374 differ by up to twenty percent. Thus, in some embodiments, the magnitude of the voltages 372 and 374 are about the same and are about $½V_{PD}$. In some embodiments, the sum of the magnitude of the voltages 372 and 374, which is the $V_{PD}$, is between about zero volts and about ten volts.

Figure 3C:
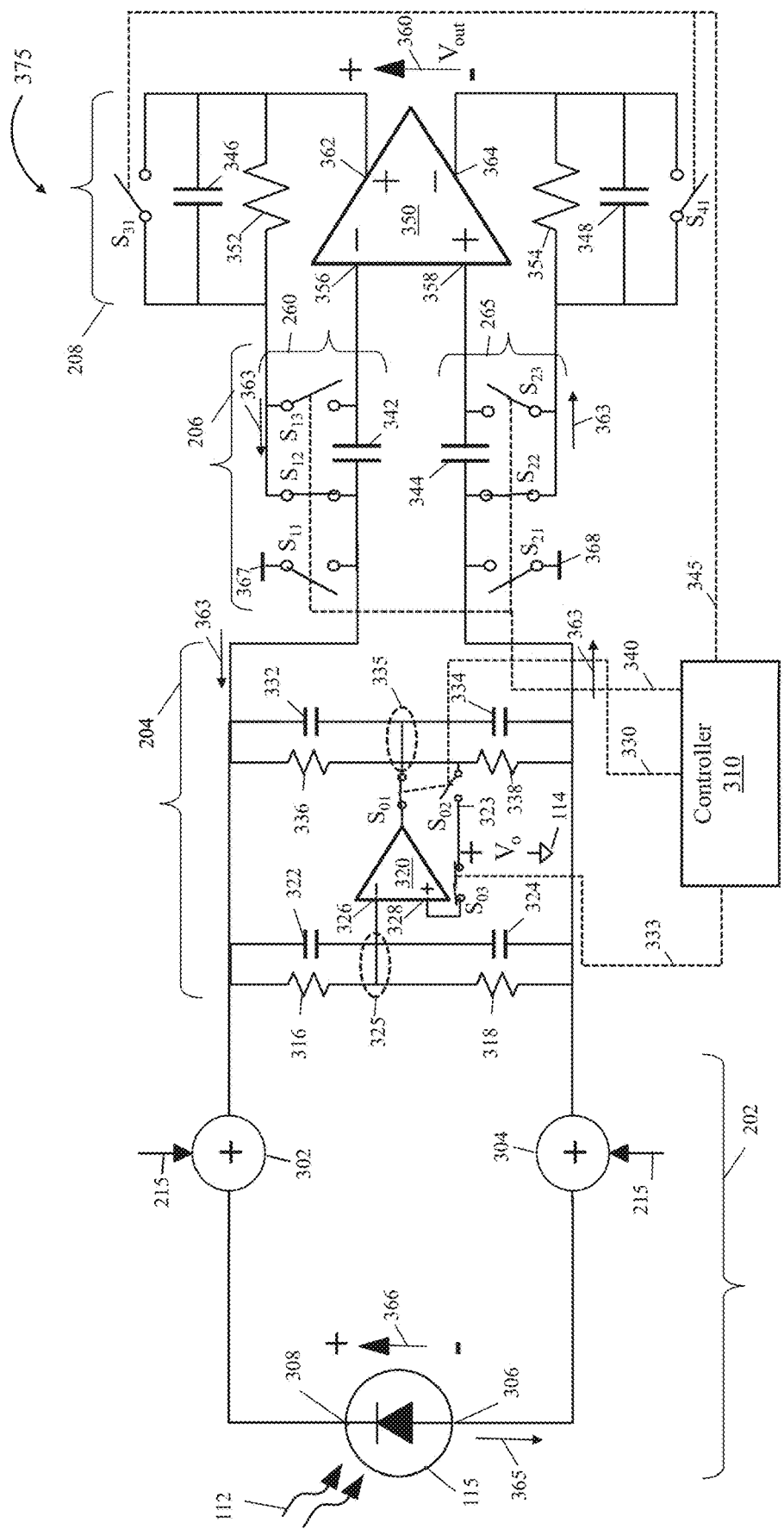

FIG. 3C shows an apparatus 375 during scan mode. The scan mode, e.g., detection mode, is used for detecting the optical signal 112. The apparatus 375, e.g. a system, is the same as the apparatus 300 and the apparatus 305 with the difference that the setting of the switches to close or open are not the same and, although exists, does not show the RC filter that is coupled to the interface 392. Also, similar to apparatus 300, the optical signal 112 impinges onto the photodetector 115. The apparatus 375 includes the detector circuit 202 and the photodetector current 365 and the current 363 circulate in the detector circuit 202 and in the apparatus 375. The apparatus 375 also includes the feedback circuit 204 with the switch $S_{01}$ that is closed, the switch $S_{02}$ that is opened, and the switch $S_{03}$ that is closed and, thus, the common mode voltage $V_o$ is applied to the non-inverting node 328 of the Op-Amp 320. Because the Op-Amp 320 is in the linear region, the common mode voltage $V_o$ is also applied to the junction point 325. The apparatus 375 further includes the bias circuit 206 with the switches $S_{12}$ and $S_{22}$ that are closed and the switches $S_1$, $S_{13}$, $S_{21}$, and $S_{23}$ that are opened. The apparatus 375 includes the amplifier circuit 208 with the switches $S_{31}$, and Su that are opened. Because of the Op-Amp 350 being in the linear region, the voltages of the non-inverting node 358 and the inverting node 356 are the same. Therefore, the voltages 372 and 374 of the capacitors 342 and 344 and the common mode voltage coupled the junction point 325 cause the cathode 308 of the photodetector 115 to have the voltage $V_o+\frac{1}{2} V_{PD}$, which is the bias voltage, the anode 306 of the photodetector 115 to have the voltage $V_o-\frac{1}{2} V_{PD}$, which is the bias voltage, and the photodetector 115 to be reverse-biased and the voltage 366 to be $V_{PD}$, which may be between 0 volts and 1 volts. In some embodiments, providing the fully differential signal paths that reduces CMI. In addition, in some embodiments, the fully differential signal paths provides the possibility of increasing the photodetector common mode voltage $V_o$ to half the positive voltage of the voltage node 116. A higher common mode voltage $V_o$ may reduce the nonlinearly rectification due to a balance swing caused by the first and second groups of diodes when EMI is present. In some embodiments, the output voltage 360 equals twice the current 363 times the resistance of the resistor 352. Thus, the output voltage 360 is proportional to the current 363 and, thus, proportional to photodetector current 365 of the photodetector 115. In addition, the output voltage 360 may have a fixed bias of $V_{PD}$, which is the reverse-bias voltage of the photodetector 115 and another bias because of the currents passing through the resistors 316, 318, 336, and 338.

Figure 3D:
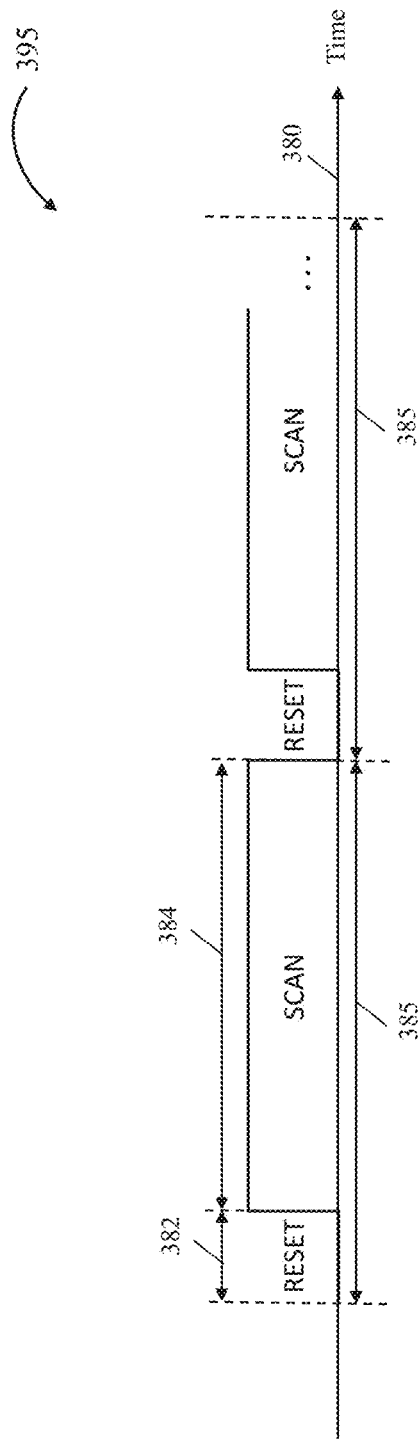

FIG. 3D shows a time-wise distribution 395 of reset and scan modes on a time coordinate 380. As shown, the reset mode may take a time 382 and the scan mode may take a time 384 and the reset-scan cycle may be repeated periodically with a period 385 that is the sum of the time 382 and the time 384. In some embodiments, the time 384 is one thousand or more times greater than the time 382. In some embodiments, the time 382 is about a few, e.g., 2 to 5, microseconds and the time 384 is between about 0.1 seconds and 5 seconds.

FIGS. 4A and 4B illustrate an amplifier circuit and a low noise amplifier circuit for the apparatus for detecting optical signals, according to various aspects of the subject technology. FIG. 4A shows the amplifier circuit 400 that includes multiple stages and first stage that is a low noise amplifier (LNA). The amplifier circuit 400 may replace the Op-Amp 350 of FIGS. 3A, 3B, and 3C. As a first stage, the amplifier circuit 400 includes the LNA, e.g., an LNA 410, which receives the input signal 442. In some embodiments, the input signal 442 is the photodetector current 365 of the photodetector 115. The LNA 410 is a resistive loaded amplifier. The resistor load has better linearity against EMI interference compared to transistors and also has a better low-frequency noise performance, as resistor has much lower flicker noise compared to transistors. However, this structure requires a higher input common mode voltage in order to achieve similar gain and thermal noise performance compared to a transistor load used in traditional amplifier structure. The higher input common mode is provided by the fully differential architecture discussed above. And as the LNA 410 provides enough gain, it may suppress the EMI interference and noise from going to the subsequent stages.

A first output signal 452 at an output node 451 of the LNA 410 may be amplified by a dual-path three-stage amplifier composed of a first amplifier 420, a second amplifier 430, a feed forward amplifier 460 and a third amplifier 440 in some embodiments. The feed forward amplifier 460 that may amplify a wide band signal is used to amplify the first output signal 452 and to generate a second output signal 458. The first amplifier 420 receives the first output signal 452 and generates a third output signal 454. The third output signal 454 is filtered by a first capacitor 432, coupled between an output of the first amplifier 420 and a ground, to generate a fourth output signal 455. The second amplifier 430 receives the fourth output signal 455 and generates a fifth output signal 456. The fifth output signal 456 is added to the second output signal 458 by an adder module 462 to generate a signal 464. The third amplifier 440 receives the signal 464 and generates a sixth output signal 448 that is added, by an adder module 466, to the signal 447, which is the signal 464 that is filtered by a second compensation capacitor 434 that is in parallel with the third amplifier 440. The adder module 466 produces as an output signal 468 at an output node 467 of the amplifier circuit 400. In some embodiments, the first capacitor 432 is used for frequency compensation of the amplifier circuit 400.

FIG. 4B shows the LNA 410 that includes two p-type metal oxide semiconductor transistors, PMOS transistors 405 and 415. As shown, bulks of PMOS transistors 405 and 415 are coupled, via connection 425, to a common source node 406 of the PMOS transistors 405 and 415. Drains 408 and 412 of the PMOS transistors 405 and 415 are coupled, via a capacitor 418 together. In some embodiments, FIG. 4A is single ended, but in some other embodiments it is differential. FIG. 4B shows the differential implementation of the LNA 410 whereby the gates 414 and 416 of the PMOS transistors 415 and 405 that correspond to a differential version of node 441 in FIG. 4A. In some embodiments, as shown, the common source node 406 is coupled to a current source 404 and the current source 404 is coupled to a voltage node 402.

The LNA 410 further includes two RC circuits coupled in parallel. A first RC circuit includes a resistor 426 coupled in parallel to a capacitor 428. A second RC circuit includes a resistor 424 coupled in parallel to a capacitor 422. Each one of the two RC circuits are coupled between the ground 114 and each end of the capacitor 418. As noted, LNA 410 includes the resistors 424 and 426 and, thus, generate thermal noise. In some embodiments, the output of the LNA is a voltage between the drains 408 and 412 of the PMOS transistors 405 and 415, which is a differential version of output node 451 in FIG. 4A. Higher resistance of the resistors 424 and 426 may lead to lower input-referred noise of the LNA 410 and the amplifier circuit 400 and better noise performance of the amplifier circuit 400. In some embodiments, the capacitors 428 and 422 provide a bypass for the EMI to the ground 114 and the capacitor 418 provides a bypass to balance a differential EMI.

The subject technology discussed above provides a circuit for detecting an optical signal by using a photodetector. The circuit is designed to provide the fully differential signal paths and an input common-mode feedback such that input common-mode interference (CMI) rejection is achieved. Also, a bias circuitry creates a differential voltage at circuit input to provide reverse-bias for a photodetector.

According to aspects of the subject technology, an apparatus for detecting optical signals includes a photodetector. The photodetector is reverse-biased by a first voltage between a cathode and an anode of the photodetector. A second voltage is added to the first voltage to provide an offset voltage for both the cathode and anode of the photodetector. The apparatus also includes a first circuit coupled to the photodetector to provide the second voltage to the photodetector. The apparatus further includes a second circuit coupled to the first circuit to provide the first voltage to the photodetector to reverse-bias the photodetector. The second circuit also provides a current of the photodetector at an output of the second circuit.

In an aspect of the subject technology, the first circuit includes a voltage source that generates the second voltage. In an aspect of the subject technology, the first circuit induces an operational-amplifier (Op-Amp) such that an inverting node of the Op-Amp is coupled between first and second capacitors and an output node of the Op-Amp is coupled between third and fourth capacitors. The voltage source is coupled between a non-inverting node of the Op-Amp and a ground and the Op-Amp is biased in a linear region. In an aspect of the subject technology, the apparatus further includes a third circuit coupled to the second circuit to receive the current of the photodetector via the first circuit and the second circuit. The third circuit further provides a third voltage proportional to the current of the photodetector. In an aspect of the subject technology, the first circuit include first and second capacitors coupled between first and second nodes of a first interface coupled between the first circuit and the photodetector and third and fourth capacitors coupled between first and second nodes of a second interface coupled between the first circuit and the second circuit. The first, second, third, and fourth capacitors are have values that pass an electromagnetic interference outside a frequency band of an optical signal to be detected by the photodetector and prevent the electromagnetic interference to pass beyond the first circuit. In an aspect of the subject technology, the second circuit provides the first voltage by two charged capacitors coupled separately to the cathode and the anode of the photodetector via the first circuit. The second circuit receives the current of the photodetector via the first circuit. In an aspect of the subject technology, the apparatus further includes a first interface coupled between the first circuit and the photodetector and a second interface coupled between the first circuit and the second circuit. The second voltage (V2) is the offset voltage and the first voltage (V1) is a reverse-bias voltage. Voltages at the cathode and the anode of the photodetector are set to $V2+\frac{1}{2}V1$ and $V2-\frac{1}{2}V1$ respectively, voltages at first and second nodes of the first interface are set to $V2+\frac{1}{2}V1$ and $V2-\frac{1}{2}V1$, and voltages at first and second nodes of the second interface are set to $V2+\frac{1}{2}V1$ and $V2-\frac{1}{2}V1$.

According to aspects of the subject technology, an apparatus includes a first circuit that includes a voltage source, a first port, and a second port. The first circuit receives a current at the first port, and receives a first voltage and a second voltage at first and second nodes of the second port respectively, The voltage source provides an offset voltage ($V_o$). The first circuit provides the first voltage plus the offset voltage and the second voltage plus the offset voltage at first and second nodes of the first port, respectively. The apparatus also includes a second circuit that includes a first capacitor and a second capacitor, coupled to second port of the first circuit. The first capacitor and the second capacitor store charges and the charges of the first and second capacitors generate the first voltage and the second voltage at the first and second nodes of the second port of the first circuit.

In an aspect of the subject technology, the apparatus further includes a third circuit coupled to the second circuit to receive the current received at the first port, via the second circuit, and to amplify the current to provide an output voltage proportional to the current. In an aspect of the subject technology, a combination of the first circuit, the second circuit, and the amplifier circuit provides fully differential signal paths. In an aspect of the subject technology, the apparatus further includes a photodetector coupled to the first port. The first and the second voltages are provided to a cathode and an anode of the photodetector respectively to reverse-bias the photodetector by a sum ($V_{RB}$) of magnitudes of the first and second voltages. In an aspect of the subject technology, voltages at the cathode and the anode of the photodetector are respectively provided as $V_o+\frac{1}{2}V_{RB}$ and $V_o-\frac{1}{2}V_{RB}$. In an aspect of the subject technology, voltages at the first and second nodes of the second port are respectively set to $V_o+\frac{1}{2}V_{RB}$ and $V_o-\frac{1}{2}V_{RB}$. In an aspect of the subject technology, the first and second nodes of the first port receive an electromagnetic interference, and the first circuit is used to filter the electromagnetic interference.

According to aspects of the subject technology, an apparatus includes a first circuit that includes a photodetector, a second circuit that provides an offset voltage ($V_o$), and a third circuit coupled the second circuit to provide a first voltage (V1) and a second voltage (V2) to a cathode and an anode of the photodetector of the first circuit to reverse-bias the photodetector by a sum ($V_{RB}$) of magnitudes of V1 and V2. V1 and V2 have opposite polarity and V1 is positive. Voltages at a cathode and an anode of the photodetector are set to $V_o+V1$ and $V_o+V2$ respectively, voltages at first and second nodes of a first interface between the third circuit and the second circuit are set $V_o+V1$ and $V_o+V2$, and voltages at first and second nodes of a second interface between the second circuit and the first circuit are set to $V_o+V1$ and $V_o+V2$. The apparatus further includes a fourth circuit coupled to the third circuit and amplifies a current of the photodetector, received via the second circuit and the third circuit, and provide an output voltage proportional to the current of the photodetector.

In an aspect of the subject technology, the third circuit includes a first capacitor and a second capacitor and the first capacitor and the second capacitors are charged to have the first and second voltages. The first capacitor and the second capacitor provide the first and second voltages to reverse-bias the photodetector. In an aspect of the subject technology, the apparatus further includes a controller and the third circuit includes a first voltage source that provides the voltage $V_o+V1$ and a second voltage source that provides a voltage $V_o+V2$. The third circuit also includes a first switch and a second switch such that the first switch is coupled between the first voltage source and a first node of the first capacitor and the second switch is coupled between the second voltage source and a first node of the second capacitor, and a second node of the first capacitor is coupled to a second node of the second capacitor. At a reset mode the controller closes the first switch and the second switch, the first capacitor is charged to V1, from the first node to the second node of the first capacitor, the second capacitor is charged to V2, from the first node to the second node of the second capacitor, and the second node of the first capacitor and the second node of the second capacitor are at the offset voltage $V_o$ provided by a third voltage source. In an aspect of the subject technology, at a scan mode, the controller opens the first switch and the second switch, applies a voltage of the first capacitor and a voltage of the second capacitor to the photodetector, and applies the voltage V1-V2 to the photodetector to reverse-bias the photodetector. In an aspect of the subject technology, the second circuit includes a third capacitor and a fourth capacitor coupled between two nodes of an input port of the second circuit and coupled via a third node to each other and a fifth capacitor and a sixth capacitor coupled between two nodes of an output port of the second circuit and coupled via a fourth node to each other, and an operational-amplifier (Op-Amp) such that an inverting node of the Op-Amp is coupled to the third node, an output node of the Op-Amp is coupled to the fourth node, and the third voltage source is coupled between a non-inverting node of the Op-Amp and a ground and the Op-Amp is biased in a linear region. In a scan mode: a cathode of the photodetector is coupled to $V_o+V1$ and an anode of the photodetector is coupled to $V_o+V2$, and the photodetector is reverse-biased by V1-V2. In an aspect of the subject technology, the first voltage and the second voltage either 1) have same magnitude, or 2) have up to ten percent difference in magnitude.

Those of skill in the art would appreciate that the various illustrative blocks, modules, elements, components, memory systems, and algorithms described herein may be implemented as electronic hardware, computer software, or combinations of both. To illustrate this interchangeability of hardware and software, various illustrative blocks, modules, elements, components, memory systems, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

It is understood that any specific order or hierarchy of blocks in the processes disclosed is an illustration of example approaches. Based upon design preferences, it is understood that the specific order or hierarchy of blocks in the processes may be rearranged, or that all illustrated blocks should be performed. Any of the blocks may be simultaneously performed. In one or more implementations, multitasking and parallel processing may be advantageous. Moreover, the separation of various system components in the embodiments described above should not be understood as requiring such separation in all embodiments, and it should be understood that the described program components and systems could generally be integrated together in a single software product or packaged into multiple software products.

As used in this specification and any claims of this application, the terms "base station," "receiver," "computer," "server," "processor," and "memory" all refer to electronic or other technological devices. These terms exclude people or groups of people. For the purposes of the specification, the term "display" or "displaying" means displaying on an electronic device.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items, and/or at least one of each of the items. By way of example, the phrases "at least one of A, B, and C" and "at least one of A, B, or C" each refer to only A, only B, or only C; any combination of A, B, and C; and/or at least one of each of A, B, and C.

The predicate words "configured to," "operable to," and "programmed to" do not imply any particular tangible or intangible modification of a subject but rather are intended to be used interchangeably. In one or more implementations, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

Phrases such as "an aspect," "the aspect," "another aspect," "some aspects," "one or more aspects," "an implementation," "the implementation," "another implementation," "some implementations," "one or more implementations," "an embodiment," "the embodiment," "another embodiment," "some embodiments," "one or more embodiments," "a configuration," "the configuration," "another configuration," "some configurations," "one or more configurations," "the subject technology," "the disclosure," "the present disclosure," and other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as "an aspect" or "some aspects" may refer to one or more aspects and vice versa, and this applies similarly to other foregoing phrases.

The word "exemplary" is used herein to mean "serving as an example, instance, or illustration." Any embodiment described herein as "exemplary" or as an "example" is not necessarily to be construed as preferred or advantageous over other embodiments. Furthermore, to the extent that the term "include," "have," or the like is used in the description or the claims, such term is intended to be inclusive in a manner similar to the term "comprise" as "comprise" is interpreted when employed as a transitional word in a claim.

All structural and functional equivalents to the elements of the various aspects described throughout this disclosure that are known or later come to be known to those of ordinary skilled in the art are expressly incorporated herein by reference and are intended to be encompassed by the claims. Moreover, nothing disclosed herein is intended to be dedicated to the public, regardless of whether such disclosure is explicitly recited in the claims. No claim element is to be construed under the provisions of 35 U.S.C. § 112(f) unless the element is expressly recited using the phrase "means for" or, in the case of a memory system claim, the element is recited using the phrase "step for."

The previous description is provided to enable any person skilled in the art to practice the various aspects described herein. Various modifications to these aspects would be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

What is claimed is:

1. An apparatus comprising:
   a photodetector, wherein the photodetector is reverse-biased by a first voltage between a cathode and an anode of the photodetector, and wherein a second voltage is combined with the first voltage to provide an offset voltage for both the cathode and anode of the photodetector;
   a first circuit coupled to the photodetector and configured to provide the second voltage to the photodetector;
   wherein the first circuit comprises an operational-amplifier (Op-Amp), wherein an inverting node of the Op-Amp is coupled between first and second capacitors, an output node of the Op-Amp is coupled between third and fourth capacitors, and a voltage source is coupled between a non-inverting node of the Op-Amp and a ground, and wherein the Op-Amp is biased in a linear region; and a second circuit coupled to the first circuit and configured to provide the first voltage to the photodetector to reverse-bias the photodetector, wherein the second circuit is also configured to provide a current of the photodetector at an output of the second circuit.

2. The apparatus of claim 1, wherein the first circuit comprises the voltage source configured to generate the second voltage.

3. The apparatus of claim 1, further comprising:
a third circuit coupled to the second circuit and configured to receive the current of the photodetector via the first circuit and the second circuit, wherein the third circuit is further configured to provide a third voltage proportional to the current of the photodetector.

4. The apparatus of claim 3, wherein the first, second, third, and fourth capacitors are configured to have values that pass an electromagnetic interference outside a frequency band of an optical signal to be detected by the photodetector and prevent the electromagnetic interference to pass beyond the first circuit.

5. The apparatus of claim 1, wherein the second circuit is configured to provide the first voltage by two charged capacitors coupled separately to the cathode and the anode of the photodetector via the first circuit, and wherein the second circuit is configured to receive the current of the photodetector via the first circuit.

6. The apparatus of claim 1, further comprising:
a first interface coupled between the first circuit and the photodetector; and
a second interface coupled between the first circuit and the second circuit, wherein the second voltage (V2) is the offset voltage and the first voltage (V1) is a reverse-bias voltage, and wherein:
voltages at the cathode and the anode of the photodetector are set to V2+½V1 and V2−½V1 respectively,
voltages at first and second nodes of the first interface are set to V2+½V1 and V2−½V1, and
voltages at first and second nodes of the second interface are set to V2+½V1 and V2−½V1.

7. The apparatus of claim 1, wherein voltages at the cathode and the anode of the photodetector are respectively provided as $V_o+½V_{RB}$ and $V_o-½V_{RB}$.

8. The apparatus of claim 7, wherein voltages at first and second nodes of a second port are respectively set to $V_o+½V_{RB}$ and $V_o-½V_{RB}$.

9. The apparatus of claim 7, wherein first and second nodes of a first port are configured to receive an electromagnetic interference, and wherein the first circuit is configured to filter the electromagnetic interference.

10. An apparatus comprising:
a photodetector;
a first circuit comprising a voltage source, a first port, and a second port, and configured to:
receive a current at the first port,
receive a first voltage and a second voltage at first and second nodes of the second port respectively, wherein the voltage source is configured to provide an offset voltage ($V_o$), and
provide the first voltage combined with the offset voltage and the second voltage combined with the offset voltage at first and second nodes of the first port respectively; and a second circuit comprising a first capacitor and a second capacitor, coupled to the second port of the first circuit, wherein the first capacitor and the second capacitor are configured to store charges, wherein the charges of the first and second capacitors are configured to generate the first voltage and the second voltage at the first and second nodes of the second port of the first circuit, wherein voltages at a cathode and an anode of the photodetector are respectively provided as $V_o+½V_{RB}$ and $V_o-½V_{RB}$.

11. The apparatus of claim 10, wherein the first circuit comprises:
an operational-amplifier (Op-Amp), wherein an inverting node of the Op-Amp is coupled between the first and second capacitors, an output node of the Op-Amp is coupled between third and fourth capacitors, and the voltage source is coupled between a non-inverting node of the Op-Amp and a ground, and wherein the Op-Amp is biased in a linear region.

12. The apparatus of claim 10, further comprising:
a third circuit coupled to the second circuit and configured to receive the current received at the first port, via the second circuit, and to amplify the current to provide an output voltage proportional to the current.

13. The apparatus of claim 12, wherein a combination of the first circuit, the second circuit, and the third circuit are configured to provide fully differential signal paths.

14. The apparatus of claim 10, wherein the photodetector is coupled to the first port, wherein the first and the second voltages are provided to reverse-bias the photodetector by a sum ($V_{RB}$) of magnitudes of the first and second voltages.

15. An apparatus comprising:
a first circuit that comprises a photodetector;
a second circuit coupled to the first circuit and configured to provide an offset voltage ($V_o$),
a third circuit coupled the second circuit and configured to provide a first voltage (V1) and a second voltage (V2) to a cathode and an anode of the photodetector of the first circuit to reverse-bias the photodetector by a sum ($V_{RB}$) of magnitudes of V1 and V2, wherein V1 and V2 have opposite polarity and V1 is positive, and wherein:
voltages at the cathode and the anode of the photodetector are set to $V_o+V1$ and $V_o+V2$ respectively,
voltages at first and second nodes of a first interface between the third circuit and the second circuit are set to voltages $V_o+V1$ and $V_o+V2$, respectively, and
voltages at first and second nodes of a second interface between the second circuit and the first circuit are set to the voltages $V_o+V1$ and $V_o+V2$, respectively; and
a fourth circuit coupled to the third circuit and configured to amplify a current of the photodetector, received via the second circuit and the third circuit, and provide an output voltage proportional to the current of the photodetector.

16. The apparatus of claim 15, wherein:
the third circuit comprises a first capacitor and a second capacitor,
the first capacitor and the second capacitor are configured to be charged to have the first and second voltages, and
the first capacitor and the second capacitor are configured to provide the first and second voltages to reverse-bias the photodetector.

17. The apparatus of claim 16, further comprising:
a controller,
wherein the third circuit comprises:
a first voltage source configured to provide the voltage $V_o+V1$ and a second voltage source configured to provide the voltage $V_o+V2$; and
a first switch and a second switch, wherein the first switch is coupled between the first voltage source and a first node of the first capacitor and the second switch is coupled between the second voltage source and a first node of the second capacitor, wherein a second node of the first capacitor is coupled to a second node of the second capacitor; and
wherein at a reset mode:
the controller is configured to close the first switch and the second switch,
the first capacitor is charged to V1, from the first node to the second node of the first capacitor,
the second capacitor is charged to V2, from the first node to the second node of the second capacitor, and
the second node of the first capacitor and the second node of the second capacitor are at $V_o$ provided by a third voltage source.

18. The apparatus of claim 17, wherein at a scan mode the controller is configured to:
open the first switch and the second switch,
apply a voltage of the first capacitor and a voltage of the second capacitor to the photodetector, and
apply a voltage V1-V2 to the photodetector to reverse-bias the photodetector.

19. The apparatus of claim 18, wherein the second circuit comprises:
a third capacitor and a fourth capacitor coupled between two nodes of an input port of the second circuit and coupled via a third node to each other; and
a fifth capacitor and a sixth capacitor coupled between two nodes of an output port of the second circuit and coupled via a fourth node to each other; and
an operational-amplifier (Op-Amp), wherein an inverting node of the Op-Amp is coupled to the third node, an output node of the Op-Amp is coupled to the fourth node, and the third voltage source is coupled between a non-inverting node of the OP-Amp and a ground, wherein the Op-Amp is biased in a linear region, and wherein in the scan mode:
the cathode of the photodetector is coupled to $V_o+V1$ and the anode of the photodetector is coupled to $V_o+V2$, and wherein the photodetector is reverse-biased by V1-V2.

20. The apparatus of claim 19, wherein the first voltage and the second voltage either:
1) Have same magnitudes, or
2) Have up to twenty percent difference in magnitude.

* * * * *